United States Patent
Thomas et al.

(10) Patent No.: US 8,502,318 B2
(45) Date of Patent: Aug. 6, 2013

(54) SRAM MEMORY CELL PROVIDED WITH TRANSISTORS HAVING A VERTICAL MULTICHANNEL STRUCTURE

(75) Inventors: Olivier Thomas, Revel (FR); Thomas Ernst, Morette (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 541 days.

(21) Appl. No.: 12/740,907

(22) PCT Filed: Nov. 7, 2008

(86) PCT No.: PCT/EP2008/065103
§ 371 (c)(1),
(2), (4) Date: Apr. 30, 2010

(87) PCT Pub. No.: WO2009/060052
PCT Pub. Date: May 14, 2009

(65) Prior Publication Data
US 2010/0264496 A1    Oct. 21, 2010

(30) Foreign Application Priority Data
Nov. 9, 2007  (FR) ...................... 07 58935

(51) Int. Cl.
*H01L 29/66*    (2006.01)
(52) U.S. Cl.
USPC ................................. 257/365; 257/E27.098
(58) Field of Classification Search
USPC ............ 257/365, E21.661, E27.098; 438/197
See application file for complete search history.

(56) References Cited

U.S. PATENT DOCUMENTS

| | | | |
|---|---|---|---|
| 4,396,996 A | 8/1983 | Oldham | |
| 5,965,914 A | 10/1999 | Miyamoto | |
| 6,121,157 A | 9/2000 | Nakajima | |
| 6,127,702 A | 10/2000 | Yamazaki et al. | |
| 6,632,696 B2 | 10/2003 | Kimura et al. | |
| 6,727,186 B1 | 4/2004 | Skotnicki et al. | |
| 6,864,519 B2 * | 3/2005 | Yeo et al. | 257/206 |
| 6,903,460 B2 | 6/2005 | Fukuda et al. | |
| 7,511,989 B2 | 3/2009 | Thomas et al. | |
| 7,518,195 B2 | 4/2009 | Ernst et al. | |
| 7,812,410 B2 | 10/2010 | Collonge et al. | |
| 7,838,948 B2 * | 11/2010 | Gossner | 257/401 |
| 2002/0028541 A1 * | 3/2002 | Lee et al. | 438/149 |

(Continued)

FOREIGN PATENT DOCUMENTS
WO    WO 2006/108987 A1    10/2006

OTHER PUBLICATIONS
Office Action issued Nov. 8, 2010, in France Patent Application No. 8 846 719.6, 4 pages.

(Continued)

*Primary Examiner* — Colleen Matthews
(74) *Attorney, Agent, or Firm* — Oblon, Spivak, McClelland, Maier & Neustadt, L.L.P.

(57) ABSTRACT

A microelectronic device including, on a substrate, at least one element such as a SRAM memory cell; one or more first transistor(s), respectively including a number k of channels (k≧1) parallel in a direction forming a non-zero angle with the main plane of the substrate, and one or more second transistor(s), respectively including a number m of channels, such that m>k, parallel in a direction forming a non-zero angle, or an orthogonal direction, with the main plane of the substrate.

14 Claims, 4 Drawing Sheets

U.S. PATENT DOCUMENTS

| | | |
|---|---|---|
| 2004/0051150 A1 | 3/2004 | Wu |
| 2004/0063286 A1 | 4/2004 | Kim et al. |
| 2004/0166642 A1 | 8/2004 | Chen et al. |
| 2004/0227187 A1 | 11/2004 | Cheng et al. |
| 2005/0094434 A1 | 5/2005 | Watanabe et al. |
| 2005/0161739 A1 | 7/2005 | Anderson et al. |
| 2006/0076625 A1* | 4/2006 | Lee et al. ............... 257/353 |
| 2006/0258132 A1 | 11/2006 | Brown et al. |
| 2007/0058419 A1 | 3/2007 | Khellah et al. |
| 2007/0126035 A1 | 6/2007 | Ernst et al. |
| 2007/0139996 A1 | 6/2007 | Ozawa |
| 2007/0196973 A1 | 8/2007 | Park |
| 2008/0149919 A1 | 6/2008 | Ernst et al. |
| 2008/0175039 A1 | 7/2008 | Thomas et al. |
| 2008/0277691 A1 | 11/2008 | Ernst et al. |
| 2009/0085119 A1 | 4/2009 | Ernst et al. |
| 2009/0203203 A1 | 8/2009 | Ernst et al. |
| 2009/0289304 A1* | 11/2009 | Pouydebasque et al. ..... 257/351 |
| 2009/0294861 A1 | 12/2009 | Thomas et al. |
| 2010/0096700 A1 | 4/2010 | Vinet et al. |
| 2010/0178743 A1 | 7/2010 | Vinet et al. |
| 2010/0219489 A1 | 9/2010 | Duraffourg et al. |

OTHER PUBLICATIONS

Yung-Chun Wu, et al. "High-performance polycrystalline silicon thin-film transistor with multiple nanowire channels and lightly doped drain structure" Applied Physics Letters, vol. 84, No. 19, May 10, 2004, American Institute of Physics, XP001220931, pp. 3822-3824.

J. L. Liu, et al. "A method for fabricating silicon quantum wires based on SiGe/Si heterostructure" Applied Physics Letters, vol. 68, No. 3, Jan. 15, 1996, American Institute of Physics, XP 000552744, pp. 352-354.

H. Okada, et al. "A Novel Wire Transistor Structure with In-Plane Gate Using Direct Schottky Contacts to 2DEG" Extended Abstracts of the 1994 International Conference on Solid State Devices and Materials, XP 000543982, pp. 971-972.

Sung-Young Lee, et al, "A Novel Multibridge-Channel MOSFET (MBCFET): Fabrication Technologies and Characteristics", IEEE Transactions on Nanotechnology, vol. 2, No. 4, Dec. 2003, pp. 253-257.

U.S. Appl. No. 12/521,377, filed Sep. 14 2009, Vinet, et al.

U.S. Appl. No. 12/521,311, filed Dec. 3, 2009, Vinet, et al.

Sung-Young Lee, et al., "Sub-25nm Single-Metal Gate CMOS Multi-Bridge-Channel MOSFET (MBCFET) for High Performance and Low Power Application", 2005 Symposium on VLSI Technology Digest of Technical Papers, pp. 154-155.

Min Sang Kim, et al., "122 Mb High Speed SRAM Cell with 25 nm Gate Length Multi-Bridge-Channel MOSFET (MBCFET) on Bulk Si Substrate", 2006 Symposium on VLSI Technology Digest of Technical Papers, 2 pages.

Masanao Yamaoka, et al., "Low Power SRAM Menu for SOC Application Using Yin-Yang-Feedback Memory Cell Technology", Symposium on VLSI Circuits, Digest of Technical Papers, Honolulu, USA, Jun. 2004, 4 pages.

Kiyoshi Takeuchi, et al., "A Study of the Threshold Voltage Variation for Ultra-Small Bulk and SOI CMOS", IEEE Transactions on Electron Devices, vol. 48, No. 9, Sep. 2001, pp. 1995-2001.

International Search Report issued Mar. 4, 2009 in PCT/EP2008/065103.

French Preliminary Report issued Apr. 29, 2008, in French Patent No. FR0758935.

* cited by examiner

SRAM MEMORY CELL PROVIDED WITH TRANSISTORS HAVING A VERTICAL MULTICHANNEL STRUCTURE

TECHNICAL AREA

The invention pertains to the area of microelectronics, and in particular to the area concerning static random access memories (SRAMs). It notably concerns a SRAM memory cell comprising a plurality of transistors with vertical multichannel structure, each transistor having a number of channels adapted in relation to the role played by this transistor in the cell, and to the number of channels allocated to the other transistors in the cell.

The invention allows a SRAM memory cell with 6 transistors to be obtained, called a "6T" cell, having improved read stability and write margin compared with a conventional 6T cell of identical size.

The invention is able to be adapted to other devices, and may notably be used in circuits forming one or more logic gates and comprising transistors with a vertical multichannel structure, each transistor having a number of channels adapted to its role in the circuit.

STATE OF THE PRIOR ART

Figure 1:
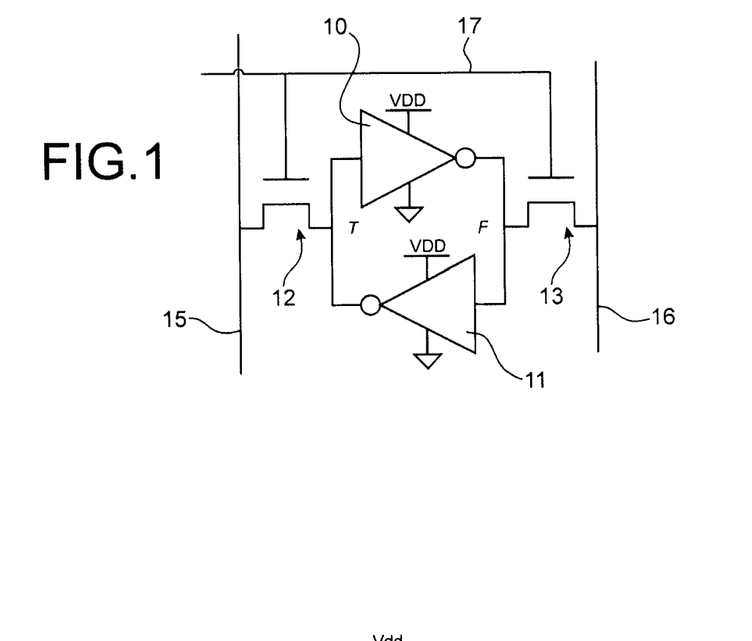
FIG. 1, illustrates an example of a static random access memory cell according to the prior art.

A conventional SRAM memory cell generally comprises two inverters 10, 11 connected in a so-called "flip-flop" configuration, and two access transistors 12, 13 connected to so-called bit lines 15 and 16, and controlled by a word line 17 (FIG. 1).

The sought after characteristics for a memory cell are:
good stability during different read, write and hold operations made on the cell,
a charge or conduction current that is as high as possible to provide the cell with a high operating speed,
a cell size that is as small as possible to obtain a memory with high density of cell integration,
a holding current that is as low as possible to minimize consumed static power.

These criteria are conflicting and compel memory designers to make compromises.

Six-transistor SRAM cells, called "6T" cells, offer a good compromise between all the above-cited criteria.

However, by seeking increasingly to reduce the size of memory cell transistors, the parameters of these transistors such as their channel width W, their channel length L, their threshold voltage $V_T$, their permeability $\mu_0$, their Na doping, their gate oxide thickness Tox, fluctuate. As indicated in documents [TAK01] and [YAM04] (referenced at the end of the present description), this leads to an increase in the sensitivity of memory cells to different sources of noise, such as capacitive coupling, inductive coupling, power noise.

The development of a memory cell having a high noise margin is therefore increasingly becoming a priority.

With conventional 6T memory cells, cell stability is determined by their static noise margin (SNM) in read mode. At the time of read access, the gain by the inverters of the cell tends to be reduced through the placing in conduction of the access transistors. To cancel out this effect, cells with 8 or 10 transistors having improved read stability have been proposed. However, despite a strong improvement in the static noise margin SNM, cells with 10 transistors and with 8 transistors require much more space than 6T cells, typically in the order of 30% more.

It is known to form a microelectronic device with transistors comprising several channels. Document US 2005/0161739 for example mentions transistor structures having several "fins".

Also, to meet problems of surface requirements, it is known to form a transistor comprising a multichannel structure, with a vertical arrangement of parallel semiconductor bars distributed in a direction orthogonal to the main plane of the substrate. This is described for example in document WO 2006/108987 A1.

The problem arises of finding a new structure for SRAM memory cell, firstly having improved read stability (SNM) compared with conventional 6T cells, whilst maintaining satisfactory space occupancy that is optionally improved.

DISCLOSURE OF THE INVENTION

The present invention concerns a microelectronic device which, on a substrate, comprises at least one element comprising:
one or more first transistors, respectively provided with a number m of channels parallel in a direction, preferably orthogonal direction, forming a non-zero angle with the main plane of the substrate,
one or more second transistors respectively provided with a number n of channels, such that n>m, parallel in a direction, preferably orthogonal direction, forming a non-zero angle with the main plane of the substrate.

According to one possible embodiment, said element may be a SRAM memory cell comprising:
at least one first access transistor and at least one second access transistor respectively provided with a number m of channels parallel in a direction, preferably orthogonal direction, forming a non-zero angle with the main plane of the substrate,
a plurality of transistors forming a flip-flop including at least one conduction transistor and at least one other conduction transistor respectively provided with a number n of channels parallel in a direction, preferably orthogonal direction, forming a non-zero angle with the main plane of the substrate, n being greater than m.

A cell with improve read stability can thus be obtained.

According to one possible embodiment, said element may be a SRAM memory cell comprising:
at least one access transistor and at least one other access transistor respectively provided with a number m of channels parallel in a direction, preferably orthogonal direction, forming a non-zero angle with the main plane of the substrate,
a plurality of transistors forming a flip-flop, including at least one charge transistor and at least one other charge transistor respectively provided with a number k of channels parallel in a direction, preferably orthogonal direction, forming a non-zero angle with the main plane of the substrate, k being smaller than m.

A cell having an improved write margin can thus be obtained.

According to one possible embodiment, said element is a SRAM memory cell comprising:
at least one access transistor and at least one other access transistor respectively provided with a number m of channels parallel in a direction, preferably orthogonal direction, forming a non-zero angle with the main plane of the substrate,
at least one conduction transistor and at least one other conduction transistor respectively provided with a number n of channels parallel in a direction, preferably orthogonal direction, forming a non-zero angle with the main plane of the substrate, n being greater than m, at least one charge transistor and at least one other charge transistor respectively provided with a number k of channels parallel in a direction preferably an orthogonal direction, forming a non-zero angle with the main plane of the substrate, k being less than m.

A cell having improved read stability and writing margin can thus be obtained.

According to one possible embodiment, said element may be a logic gate or a circuit comprising one or more logic gates.

In this case, the first plurality of transistors may be formed of transistors in which priority is given to high current flow, whilst the transistors of the second plurality of transistors may be transistors in which priority is given to high dynamic power.

A fewer number of channels may be used for the second plurality of transistors, to reduce the input capacity of the logic gate.

According to one possibility, the first plurality of transistors may be formed of transistors of a first type from among an N-type or P-type, whilst the transistors of the second plurality of transistors may be formed of a second type, from among a P-type or an N-type and different from the first type.

The invention also concerns the implementation of a method to form a microelectronic device, comprising the formation on a substrate of one or more elements comprising:

one or more first transistors respectively provided with a number n of channels parallel in a direction forming a non-zero angle with the main plane of the substrate, one or more second transistors respectively provided with a number n>m of channels parallel in a direction forming a non-zero angle with the main plane of the substrate.

The m channels of the first transistor(s) may be formed of a first stack of m semiconductor layers.

The n channels of the second transistor(s) may be formed in a second stack of n semiconductor layers.

According to one possibility, said first stack and said second stack may be of the same height.

This can avoid disadvantages related to any planarity defect of the device formed by the assembly of transistors.

Said second stack may comprise semiconductor layers of different thickness.

The first stack and the second stack may each be formed of alternating layers of semiconductor layers in a first semiconductor material and semiconductor layers in a second semiconductor material.

According to one possibility, said elements may be the cells of a SRAM memory.

According to one possibility, said elements may form a logic gate or a circuit comprising one or more logic gates.

BRIEF DESCRIPTION OF THE DRAWINGS

The present invention will be better understood on reading the description of examples given solely for indication purposes which are in no way limiting, with reference to the appended drawings in which.

a first example of a transistor with vertical multichannel structure formed by a plurality of semiconductor bars associated with a gate positioned above and below the bars, a second example of a transistor with vertical multichannel structure formed of a plurality of semiconductor bars associated with a gate coated around the bars.

Identical, similar or equivalent parts in the different figures carry the same reference numbers to facilitate cross-reading between the figures.

The different parts illustrated in the figures are not necessarily drawn to uniform scale, for better legibility of the figures.

DETAILED DESCRIPTION OF PARTICULAR EMBODIMENTS

Figure 2:
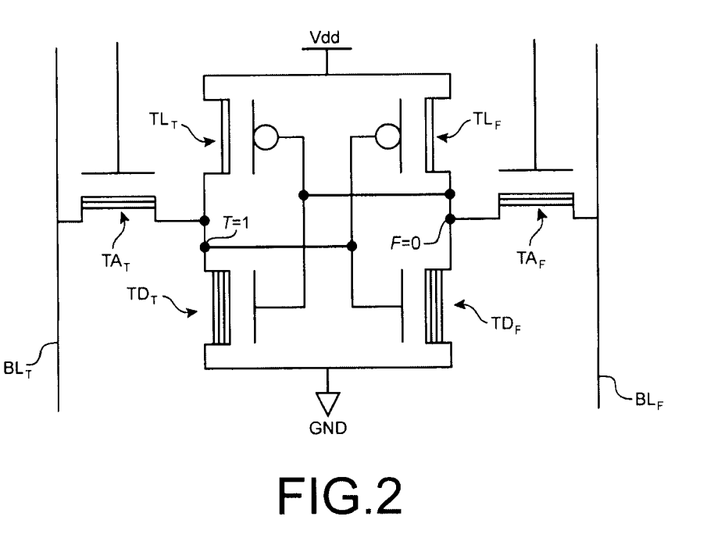
FIG. 2 illustrates an example of a 6T memory cell according to the invention, provided with 6 multi-channel transistors, including two access transistors with m channels, two conduction transistors with n channels, and two charge transistors with k channels (with k<m<n)

One example of a microelectronic device according to the invention in the form of a SRAM memory cell with six multichannel transistors will now be described with reference to FIG. 2.

The cell comprises a first charge transistor $TL_T$ and a second charge transistor $TL_F$, e.g. of PMOS type, and respectively comprising an intended or predetermined number k of channels (k being an integer of 1 or more). The k channels of transistors $TL_T$ and $TL_F$ may be in the form of a plurality of wires, bars or parallelepiped or cylindrical blocks, respectively connecting a source region and a drain region, and arranged parallel to each other and to a substrate on which the transistors are formed. The wires or bars or blocks are also aligned in a direction forming a non-zero angle with the main plane of the substrate, preferably in a direction orthogonal to the main plane of the substrate, and thereby form a structure with several channels that will be called a "vertical multi-channel" structure.

The cell is also provided with a first access transistor $TA_T$ and a second access transistor $TA_F$, e.g. of NMOS type, each comprising an intended or predetermined number m of channels. The number m of channels provided for the access transistors $TA_T$ and $TA_F$ is different to the number k for the charge transistors $TL_T$ and $TL_F$, and may be such that m≧k.

The m channels of the access transistors $TA_T$ and $TA_F$ are also in the form of wires, or bars or blocks parallel to each other and to the substrate, and aligned in a direction forming a non-zero angle with the main plane of the substrate, in particular in a direction orthogonal to the main plane of the substrate. The m channels can therefore also form a vertical multichannel structure with m channels.

The cell also comprises a first conduction transistor $TD_T$ and a second conduction transistor $TD_F$ e.g. of NMOS type, and comprising an intended or predetermined number n of channels.

The n channels of transistors $TD_T$ and $TD_F$ are also in the form of wires, bars or blocks, parallel to each other and to the substrate, and aligned in a direction orthogonal to the main plane of the substrate. These wires, bars or blocks form a vertical multichannel structure with n channels.

The predetermined number n of channels of the conduction transistors $TD_T$ and $TD_F$, is different to the number k for the charge transistors $TL_T$ and $TL_F$, and to the number m for the access transistors $TA_T$ and $TA_F$. The planned number m of channels for the access transistors $TA_T$ and $TA_F$ may be chosen in relation to the number n of channels for the conduction transistors $TD_T$ and $TD_F$ and to the number k for the charge transistors $TL_T$ and $TL_F$.

The number n of channels provided for the conduction transistors $TD_T$ and $TD_F$ is preferably greater than the number m for the access transistors $TA_T$ and $TA_F$.

The number of channels of the different transistors in the cell is preferably such that: $n>m \geq k$.

The charge transistors $TL_T$, $TL_F$ and conduction transistors $TD_T$, $TD_F$ are arranged so as to form a flip-flop, designed to control and hold information kept by a first storage node T, and a second storage node F of the cell. The first storage node T may be intended to hold a given item of logic information, whilst the second storage node F is intended to hold a logic data item complementary to said logic data item.

The charge transistors $TL_T$ and $TL_F$ may be connected to a supply voltage VDD and their function is to maintain a logic level '1', for example equal to a potential VDD, at either one of the storage nodes T and F of the cell, in relation to a memorized logic value.

The conduction transistors $TD_T$ and $TD_F$ may be connected to a ground potential GND and their function may be to maintain a logic level '0', for example equal to the GND potential at either one of the storage nodes in relation to the memorized logic value. The first charge transistor $TL_T$ and the first conduction transistor $TD_T$ form a first inverter for the cell, whilst the second charge transistor $TL_F$ and the second conduction transistor $TD_F$ form a second inverter. In this example, a logic level '1' is memorized at the first node T of the cell.

The role of the two access transistors $TA_T$ and $TA_F$ is, during a read or write cycle, to authorize access to the potentials of the storage nodes T and F.

The respective gates of the first access transistor $TA_T$ and second access transistor $TA_F$ are connected to a word line WL capable of conveying a polarization signal, and which is dedicated to the cell's read and write operations.

The first access transistor $TA_T$ is connected to a bit line $BL_T$, whilst the second access transistor $TA_F$ is connected to a second bit line $BL_F$.

In this cell, the number of channels of a given transistor is designed or predetermined in relation to the role of this transistor in the cell, and to the number of channels provided for the other transistors.

One example of the functioning of the cell is as follows:

In holding mode, the word line WL is held at a ground potential GND. The access transistors $TA_T$ and $TA_F$ are then placed in a blocked state so that the memory cell cannot be accessed whether for read or write operations.

To place in read mode, the bit lines $BL_T$ and $BL_F$ of the cell are previously charged at potential VDD. Then, to allow read access to the storage nodes T and F, the word line WL is set at potential VDD. The bit lines $BL_T$ and $BL_F$ can be left to float.

The stability of the cell in read mode depends on the amplitude of the voltage of the storage node dedicated to maintaining the logic level '0', for example the second node F. This voltage must preferably remain lower than the switching voltage of the first inverter connected to the storage node dedicated to maintaining the logic level '1', for example the first node T. This condition is related to the voltage divider between the second bit line $BL_F$ and the cell ground GND, formed by the second access transistor $TA_F$ and the second conduction transistor $TD_F$ connected to the second node of logic level '0'.

To improve the read noise margin, the cell transistors may be implemented so that the linear current passing through the second conduction transistor $TD_F$ is greater than the saturation current of the access transistor $TA_F$.

In a conventional 6T cell, the ratio of current gain r between the conduction and access transistors $r=(W/L)_{TD}/(W/L)_{TA}$ may be in the order of 2 for example, with bulk substrate technology and a critical gate size in the order of 90 nm.

For a vertical multichannel structure, this ratio r may be estimated with $(W/L)_{TD}$ being the ratio of the accumulated width of all the channels over the length of one of said channels of a conduction transistor, and $(W/L)_{TA}$ being the ratio of the accumulated width of all the channels over the length of one of said channels of an access transistor. For gate technologies with a critical size of less than 65 nm, this ratio r may be greater than 2 or 3, which has an impact on the gain in density of memory cells.

Co-integration of access transistors $TA_T$ and $TA_F$ provided with a vertical multichannel structure comprising m channels, and of conduction transistors $TD_T$ and $TD_F$ provided with a vertical multichannel structure comprising n channels, the number n of channels being greater than the number m of channels of the access transistors, makes it possible to obtain a higher ratio r than with conventional 6T cell structures, for same space requirements or occupied surface area on the substrate of the memory cell. This therefore makes it possible to improve the cell's read noise margin. Said co-integration may also allow a same ratio r to be obtained as with prior art cells, but with smaller space requirements. Therefore the same noise margin can be obtained as with a conventional cell but with a structure of smaller size.

To place in write mode, one of the two bit lines is precharged at potential VDD, e.g. the second bit line $BL_F$, whilst the complementary bit line $BL_T$ may be polarized at the ground potential GND. Then to write in the cell, the word line WL is placed at potential VDD. A write operation is properly carried out when the voltage of the storage node of logic level '1', e.g. the first node T, falls to below the switching voltage of the second inverter connected to the storage node of logic level '0', e.g. the second node F. Said condition is related to the voltage divider between the supply voltage of the cell VDD and the first bit line $BL_T$, formed by the first charge transistor $TL_T$ and the first access transistor $TA_T$ connected to the storage node of logic level '1', e.g. the first node T.

To obtain an improved write margin, the transistors are implemented so that the conduction current $I_{ON-TAT}$ passing through the first access transistor $TA_T$ is greater than the conduction current $I_{ON-TLT}$ of the first charge transistor $TL_T$.

A ratio of current gain q, between the charge and access transistors $q=(W/L)_{TL}/(W/L)_{TA}$, in which $(W/L)_{TL}$ is the ratio of the accumulated width of all the channels over the length of one of said channels of a charge transistor and $(W/L)_{TA}$ is the ratio of the accumulated width of all the channels over the length of one of said channels of an access transistor is designed to be close to 1, for transistors with a critical gate size in the order of 90 nm.

In memory cells provided with transistors comprising gates of less than 65 nm, fluctuations in the method of fabrication of the transistors may influence the write margin of the cells and lead to a decrease in ratio q, which in prior art cells can only be offset by an increase in the size of the access transistors and conduction transistors.

Co-integration of charge transistors $TL_T$ and $TL_F$, provided with vertical multichannel structure comprising k channels, and of access transistors $TA_T$ and $TA_F$ provided with vertical multichannel structure comprising m channels, the number m of channels being higher than the number k for the charge transistors, makes it possible obtain a higher ratio q than with a conventional 6T cell, size or occupied cell surface being identical, to improve the cell's write margin.

The proposed 6T memory cell may therefore comprise improvements both in terms of read stability and write margin, compared with a conventional 6T cell, for an identical cell surface.

The designing from the viewpoint of transistor sizing for a cell according to the invention, may be made in two steps:

During a first step, a number of channels for each transistor is determined in relation to the role of this transistor. The number of channels allocated to a transistor depends in particular on the conduction current it is desired to obtain for this transistor, and on the number of channels allocated to the other transistors, to adjust the ratios r and q.

During a second step, the transistor sizing may be fine-tuned with respect to its geometry and in particular with respect to the respective length L of the bars forming its channels and the respective width W of the bars forming its channels.

According to one example, provision may be made for a current gain ratio between the conduction and access transistors in the order of 2, to guarantee good read stability.

Figure 4A:
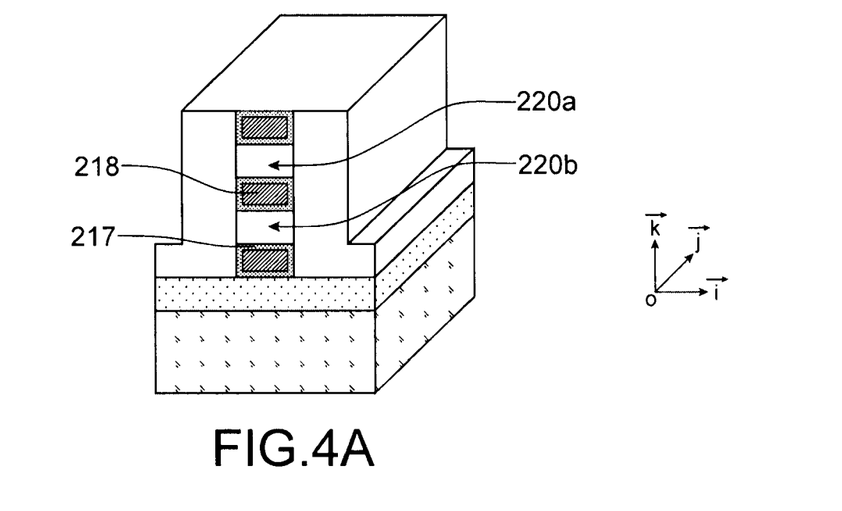

The number of channels X in a transistor such as illustrated FIG. 4A, may be equal to: X=1+2*Y, in which Y is the number of bars forming the multichannel structure. The number of channels X for a transistor comprising a multichannel structure such as described with reference to FIG. 4A, may be chosen using the following model, having regard to access resistances at the source and drain:

$$I_{SAT\_x} = X * \alpha * 1/((\beta/I_{SAT\_0}) + (R_X - R_0/Vdsat))$$

in which:
$I_{SAT\_X}$: the desired saturation current for the transistor,
x: the total number of channels,
$\alpha$ and $\beta$: non-dimensional correction parameters notably taking short-channel effects into account,
$I_{SAT\_0}$: the saturation current of a reference transistor with single channel and of same length M as the bars of said multichannel transistor,
$R_X$: effective average access resistance seen by each channel of the multichannel transistor,
Vdsat: the saturation drain voltage.

To obtain a gain ratio of 2 between the conduction and access transistors, provision may be made for a number of 9 channels for the conduction transistors and 5 channels for the access transistors, which for example allows a gain ratio in the order of 1.48 to be obtained taking into account the access resistances which would for example lead to a reduction in the order of 20% in the current generated per additional channel. For one same density of integration as a NAND2 gate of a fan-out of 1.

Then, to fix this ratio of current gain between the access and conduction transistors at a value in the order of 2, during a second step provision may be made for a width W of the conduction transistors that is 33% wider than the width of the access transistors.

According to this same example, it is possible to provide for a ratio of current gain between the charge and access transistors in the order of 0.7, to guarantee good write stability. As previously, to obtain this gain, a number of 3 channels may be provided for the charge transistors compared with 5 channels for the access transistors, which for example allows a gain ratio of 0.68 to be obtained, taking access resistances into account.

FIG. 4A gives an example of a vertical multichannel structure of a transistor which may be integrated in a device of the invention.

In this example, on a substrate 200, the structure comprises a plurality of semiconductor bars 220a, 220b, aligned in a direction orthogonal to the main plane of the substrate 200 (the main plane being a plane defined by a substrate plane parallel to plane $[O; \vec{i}; \vec{j}]$ of a reference $[O; \vec{i}; \vec{j}; \vec{k}]$).

In this example, at least one layer of gate dielectric material 217 and at least one layer of gate material 218 are formed above and below the semiconductor bars 220a, 220b.

Figure 4B:
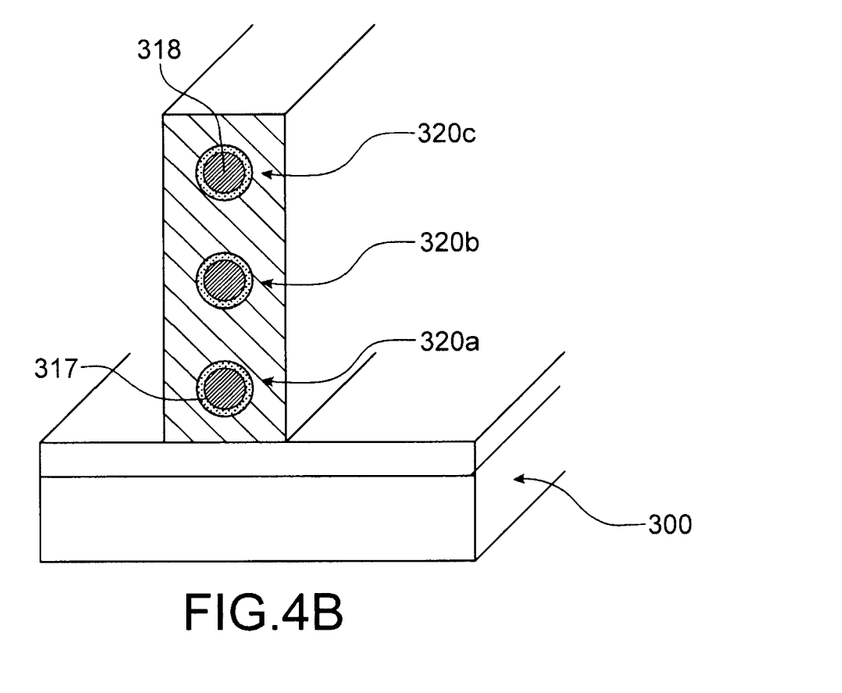

FIG. 4B gives another example of a vertical multichannel structure of a transistor which may be integrated in a device of the invention. In this example, the structure is formed on a substrate 200 of a plurality of semiconductors bars 220a, 220b aligned in a direction orthogonal to the main plane of the substrate 200 (the main plane being a plane defined by a plane of the substrate parallel to reference $[O; \vec{i}; \vec{j}]$ of a reference $[O; \vec{i}; \vec{j}; \vec{k}]$).

In this example, at least one layer of gate dielectric material 217 and at least one layer of gate material 218 are formed around the semiconductor bars 220a, 220b.

One example of a method to form a device comprising, on one same substrate, a plurality of transistors including at least one transistor with a vertical multichannel structure such as described previously with reference to FIG. 4A and having a predetermined number m of channels and at least one other transistor with a vertical multichannel structure (also described with reference to FIG. 4A) having a number n of predetermined channels, such that n>m, will now be described in connection with FIGS. 3A-3F.

Figure 3A:
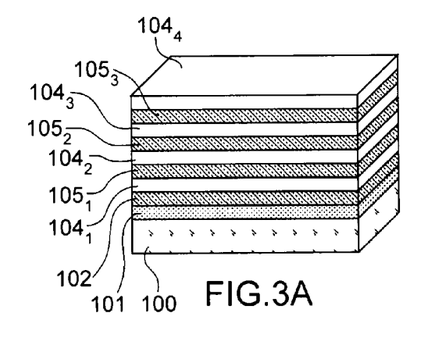
FIGS. 3A-3F illustrate an example of a method to form several transistors with vertical multi-channel structure, having a different number superimposed channels and carried by one same substrate, FIGS. 4A, 4B respectively illustrate.

First, on a substrate e.g. on the semiconductor layer 102 of a substrate 100 of semiconductor-on-insulator 101 type (SOI) a stack 105 is formed of semiconductor layers $104_1$, $105_1$, ..., $104_4$, $105_3$, comprising alternate layers $105_1$, qj$105_2$, ..., $105_4$, in a first semiconductor material such as Si for example and layers $104_1$, $104_2$, ..., $104_4$, in a second material different from the first semiconductor material. The second material may be a semiconductor material such as SiGe or doped Si e.g. phosphorus-doped Si, or an insulator material such as $SiO_2$ for example (FIG. 3A).

The second material may be a material intended to be etched selectively with respect to the first semiconductor material. The stack 105 comprises a number of semiconductor layers $104_1$, $105_1$, ..., $104_4$, $105_3$, chosen in relation to the number of channels it is desired to form for each of the vertical multichannel structures of the transistors.

Figure 3B:
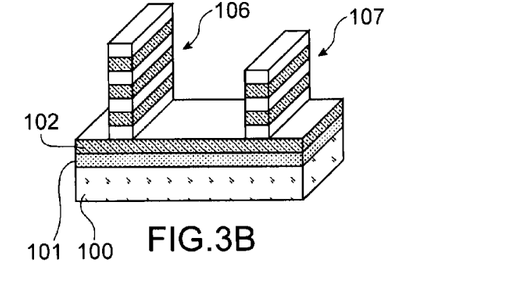

This stack 105 is then etched, so as to form at least one first block 106 in which a multi-channel structure having a predetermined number m of channels is intended to be made, and at least one second block 107 in which another multichannel structure is intended to be made having a predetermined number n of channels, such that n>m.

The first block 106 may be formed for example of a chosen number of stacked bars formed by photolithography for example, then by etching a first part of the stack 105, through a mask. The second block 107 may be formed for example of a chosen number of stacked bars that is smaller in number than the bars of the first block 106. The second block 107 may be formed by photolithography for example, then by etching a second part of the stack 105 through a mask.

To form the second block 107, with fewer stacked bars than the first block 106, it is possible prior to said photolithography and etching steps, to remove one or more layers of said second part of the stack 105 whilst protecting said first part of the stack 105 with a mask from this removal process. This removal may be made for example using plasma etching with in situ control over the materials present during etching.

According to one variant, to form the second block 107, having fewer stacked bars than the first block 106, one or more bars of said second block 107 may have been removed whilst the first block 106 was being protected from the removal process using a mask. Said removal may be performed using plasma etching for example with in situ control over the materials present during the etching.

According to one possible embodiment, the semiconductor layer 102, e.g. in Si, may be kept intact, also by means of a mask, during the formation of the blocks 106 and 107 of stacked bars.

Figure 3C:
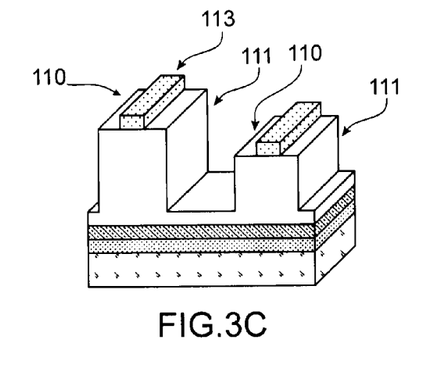

Next, semiconductor regions 110, 111 are formed against the flanks of blocks 106 and 107. These semiconductor regions are intended to form source and drain regions and may be formed for example by epitaxial growth on the semiconductor layer 102. The semiconductor source and drain regions may be in a second semiconductor material e.g. Si. During growth, the blocks 106, 107 may respectively be coated on the topside with a mask 113 e.g. in $Si_3N_4$ (FIG. 3C).

Figure 3D:
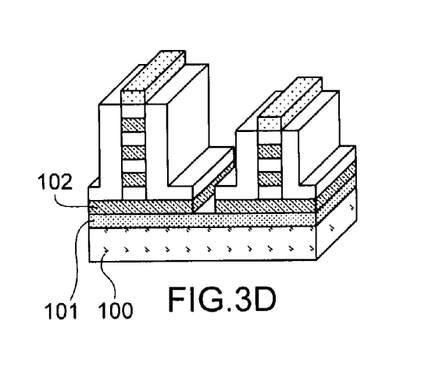

Then, after a photolithography step during which part of the blocks 106, 107 is protected, the edges of the semiconductor regions 110,111 are etched to expose the flanks of the blocks 106, 107 located at the ends of the stacked bars. It is also possible, during this step, to form at least one trench 114 between the blocks 106 and 107 to separate the two future transistors (FIG. 3D).

Figure 3E:
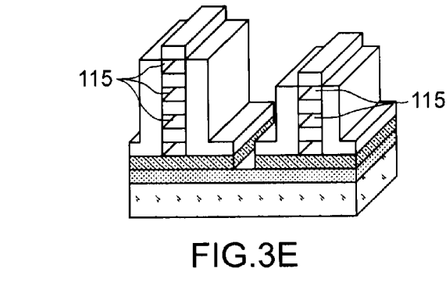
Figure 3F:
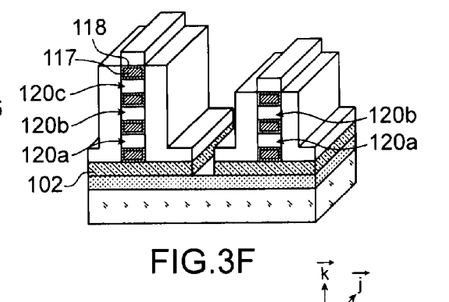

This is followed by selective removal of the bars in the second material e.g. in SiGe, in the blocks 106 and 107, so as only to maintain the bars in the first semiconductor material e.g. the bars in Si. The removal of the second material leads to forming void spaces 115 between the bars in the first semiconductor material (FIG. 3E). The void spaces are then filled with at least one gate dielectric 117 e.g. $HfO_2$ or $SiO_2$, and at least one gate material 118 e.g. TiN or a stack of polySi and TiN (FIG. 3F).

Gates are then formed for each of the transistors by performing lithography steps for example and etching of gate contacts.

With said method it is possible to form, on one same substrate 100, at least one first transistor provided with a number n (in this example equal to 3) of channels 120a, 120b, 120c parallel and aligned in a direction orthogonal to the main plane of the substrate, and at least one second transistor provided with a number m (in this example equal to 2), such that n>m, of channels 120a, 120b parallel in a direction forming a non-zero angle, and aligned in a direction orthogonal to the main plane of the substrate (the main plane of the substrate being a plane passing through the substrate and parallel to the layer 102 i.e. parallel to the plane [O; $\vec{i}$; $\vec{k}$] of an orthogonal reference [O; $\vec{i}$; $\vec{j}$; $\vec{k}$] defined in FIG. 3F).

Said method is not only limited to the forming of two different multichannel structures, but can also be implemented for the forming of more than 2 different multichannel structures.

Said method is particularly adapted to the fabrication of transistors of a memory cell such as described above in connection with FIG. 2, and which comprises several transistors respectively provided with a vertical multichannel structure with k channels, several transistors respectively provided with a vertical multichannel structure with n channels, several transistors respectively provided with a vertical multichannel structure with m channels, in which n≠k≠m, and n is determined in relation to m and optionally in relation to k.

The method just described may be implemented to form types of components or elements other than memories, and may be applied for example to the fabrication of components or elements of a microelectronic device forming a logic circuit such as a logic gate. Said method is also adapted to form the transistors of a logic gate and which comprises a plurality of transistors including one or more transistors respectively provided with a vertical multichannel structure with n channels, and one or more transistors respectively provided with a vertical multichannel structure with k channels, several transistors respectively provided with a vertical multichannel structure with m channels, in which m≠k.

A variant of the method (not illustrated) to form the block 106, 107, will now be given.

First, a masking e.g. an insulating, layer is deposited on the semiconductor layer 102 of the initial SOI substrate.

Photolithography is then carried out intended to open the insulating mask layer in a given region, so as to form a cavity. A first stack formed alternately of layers in the first semiconductor material and of layers in the second material is then formed in said cavity, for example by successive epitaxies.

The insulating layer is then removed. These steps are reiterated to form a second stack, comprising a greater number of layers than the first stack, and in which a greater number of channels is intended to be formed.

The two stacks are then etched to form the blocks 106 and 107.

This method may be put to advantageous use for the design and fabrication of a logic gate with improved fan-out. Fan-out is a measurement of the capacity of a logic gate to act as source for other logic gates. The fan-out of a CMOS logic gate may be quantified for example with respect to the charge and discharge time of this gate, a fan-out of 1 corresponding to a gate charged by itself, whilst a fan-out of 2 corresponds to a gate charged by two gates of fan-out of 1 and having an identical switching time. Two possible size parameters of the logic gate may be used: a first parameter is the geometry of the transistors of the gate, more particularly the respective width W of the channels of the structure and the respective length L of the channels of the structure. A second parameter is the number of channels with vertical multichannel structure provided for each transistor of the gate, notably in relation to a compromise between the desired current density for this transistor when it is conducting and a minimum gate capacity for a desired reduction in dynamic power related to this transistor.

It is therefore possible to form a logic circuit comprising:
  one or more transistors for which priority is given to current flow, and to which a number n of channels is allocated for example, and
  one or more transistors for which priority is given to gain in dynamic power and to which a number m of channels is allocated (with m<n).

In cases when the access resistances to the drain and access resistances to the source are negligible, a vertical multichannel transistor structure provided with 3 channels for example may allow the saturation current of the transistor to be multiplied by a factor in the order of 3, compared with a conventional transistor provided with a single channel having the same geometry as the respective geometry of the channels of the multichannel structure.

The number of channels X in a transistor such as illustrated FIG. 4A, depending on the stack is equal to: X=1+2*Y, in which Y is the number of bars forming the multichannel structure. If the access resistances are not negligible: according to one example the number of channels X for a transistor comprising a multichannel structure such as described with reference to FIG. 4A may be chosen using the following model, taking into account the access resistances at the source and drain:

$$I_{SAT\_x} = X * \alpha * 1/((\beta/I_{SAT\_0}) + (R_X - R_0/Vdsat))$$

in which:

$I_{SAT\_x}$: the desired saturation current for the transistor, x: the total number of channels, α and β: non-dimensional correction parameters notably taking into account short-channel effects, $I_{SAT\_0}$: the saturation current of a reference transistor with single channel and of same length L as the bars of said multichannel transistor, $R_X$: the effective average access resistance seen by each channel of the multichannel transistor, Vdsat: the saturation drain voltage.

One first advantage brought by the use of multichannel transistors to form a logic gate is the following:

If it is desired, for example to form a logic gate of type NAND2 i.e. NO-AND gate with 2 inputs and fan-out of 3, the cell must preferably be capable of providing or absorbing 3 times more current than a NAND gate with 2 inputs and fan-out of 1. For this purpose, 2 additional channels may be provided compared with a single-channel transistor, which allows a gain in total saturation current in the order of 2.4 to be obtained for example, taking into access resistance into account.

If it is considered that saturation current increases linearly with the width W of the transistors, an increase in the order of 25% of the width of the transistor would have allowed the same objective of 3 times more current to be achieved by a single-channel transistor.

In other words, the use of said logic gate using transistors provided with a multichannel structure allows a gain in surface area to be achieved that is in the order of 75%, compared with a single-channel transistor design, for identical performance levels.

A second advantage brought by the integration of transistors with vertical multi-channel structure to form a logic gate is the obtaining of balanced rise and fall times. The sizing of the logic gate may be based on two parameters:

the mobility ratio between the N-type transistors and P-type transistors, and the number of transistors in cascade or stacked, for example per branch between the gate output and a supply potential. For example, for a logic gate of NAND3 type with a fan-out of 2 and a mobility ratio under consideration: $\mu n/\mu p = 2$ between N-type transistors and P-type transistors, an additional number of 5 channels may be provided and 7 additional channels compared with a single-channel transistor for NMOS and PMOS transistors respectively, considering the case in which the access resistances would deteriorate the current generated per additional channel by 20%. The resulting total saturation current for PMOSs is 4 times greater than for one channel, and 5.6 times greater for NMOSs. This also allows the occupied surface area to be reduced by a factor of 4, electrical performance being identical, for P-type transistors and by a factor of 5.6 for N-type transistors.

It is therefore possible to form a logic circuit comprising:

one or more transistors of a first type, in particular of P-type, with a vertical multichannel structure comprising n channels, and one or more transistors of a second type, in particular of N-type, with a vertical multichannel structure comprising m channels (with n>m).

Figure 5A:
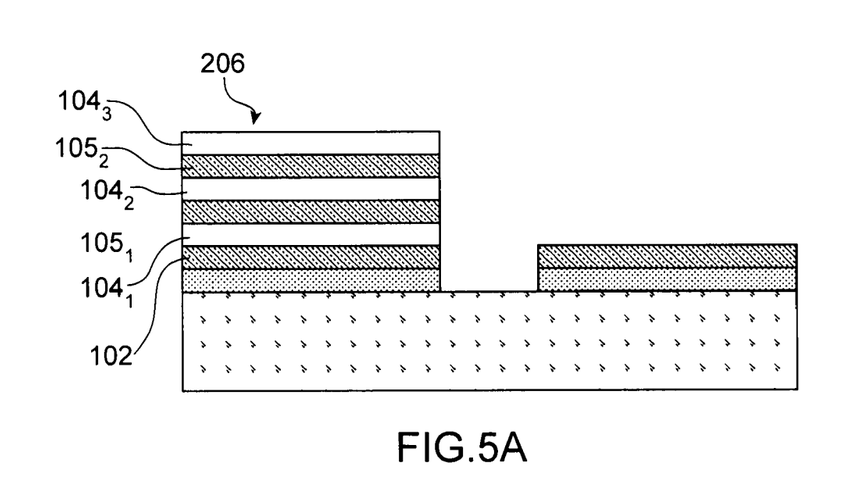
FIGS. 5A-5B illustrate another example of a method to form several transistors with vertical multichannel structure having a different number of superimposed channels and carried by one same substrate.
Figure 5B:
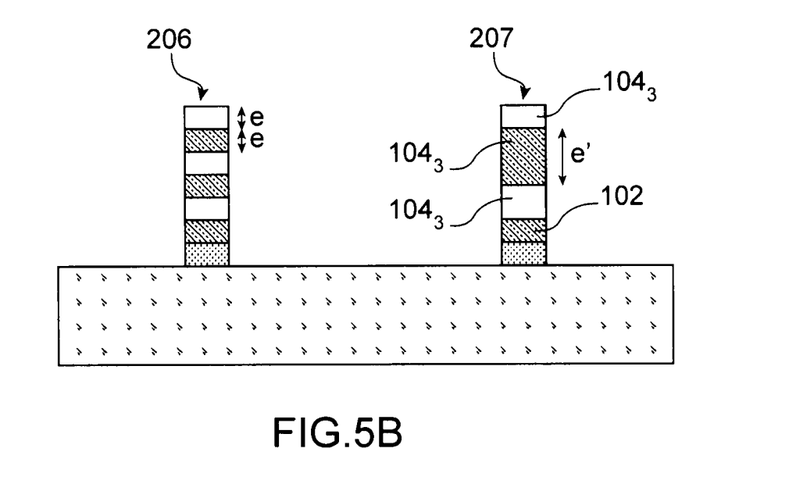

One variant of the example of the method to form a device comprising, on one same substrate, a plurality of transistors including at least one transistor with vertical multichannel structure having a predetermined number m of channels, and at least one other transistor with vertical multichannel structure having a predetermined number n of channels, such that n>m, will now be given with reference to FIGS. 5A-5B.

First, on the substrate 100 in particular on a first region of the semiconductor layer 102 of the substrate 100, a stack of semiconductor layers is formed 104₁, 105₁, ..., 104₃, alternately comprising layers 102, 105₁, 105₂ in a first semiconductor material e.g. Si, and layers 104₁, 104₂, 104₃, in a second material different from the first semiconductor material. The second material may be a material provided so that it can be etched selectively with respect to the first semiconductor material.

The stack 205 comprises a number of semiconductor layers chosen in relation to the number of channels it is desired to form for each of the vertical multichannel structures of the transistors.

This first stack forms a first block 206 in or on which a multichannel structure is to be formed having a predetermined number m of channels. The first stack may be formed for example by one or more epitaxies on the first region, whilst the other regions of the semiconductor layer are protected using a mask in SiO₂ for example.

On a second region of the semiconductor layer 102 of the substrate 100, a second stack of semiconductor layers 204₁, 205₁, 204₂ is formed comprising alternating layers in said first material and layers in said second material. The second stack may be formed for example by one or more epitaxies whilst the first stack is protected for example by a mask e.g. in SiO₂, which is subsequently removed (FIG. 5A).

The first region and the second region may have been formed by etching the semiconductor layer 102 and the insulating layer of the substrate.

This second stack may be formed with a thickness of same height as the first stack, whilst comprising fewer layers than the first stack. For this purpose, some layers 204₁, 205₁ of the stack may be formed with greater thickness than those of the other layers and in particular thicker than those of the first stack (FIG. 5B).

Next the steps such as described previously with reference to FIGS. 3A-3F can be carried out.

CITED DOCUMENTS

[TAK' 01]: K. Takeuchi, et al., "*A Study of Threshold Voltage Variation for Ultra SmallBulk and SOI CMOS*", IEEE TED, VOL. 48, No. 9, September 2004.

[YAM'04]: M. YAMAOKA, et al., "*Low Power SRAM Menu for SOC Application Using Yin-Yang-Feedback memory Cdl Technology*", Symposium on VLSI circuits, Digest of Technical Papers, Honolulu, USA, June 2004.

The invention claimed is:

1. A microelectronic device comprising, on a substrate, at least one element comprising:

one or more first transistors including, in a direction forming a non-zero angle with the main plane of the substrate, a number n of parallel channels in a form of a plurality of bars parallel to each other and to the substrate, said bars being formed in a first stack comprising a first number of semiconductor layers and being aligned in a direction forming a non-zero angle with the main plane of the substrate; and one or more second transistors including, in a direction forming a non-zero angle with the main plane of the substrate, a number m of parallel channels such that n>m in a form of a plurality of bars parallel to each other and to the substrate, said bars being formed in a second stack comprising a second number of semiconductor layers different from said first number of semi-conductor layers and being aligned in a direction forming a non-zero angle with the main plane of the substrate.

2. The microelectronic device according to claim 1, wherein the element is a static random access memory cell, the cell comprising:

at least one access transistor and at least one other access transistor respectively including a number m of channels parallel in a direction forming a non-zero angle with the main plane of the substrate;

a plurality of transistors forming a flip-flop including at least one conduction transistor and at least one other conduction transistor respectively including a number n of channels parallel in a direction forming a non-zero angle, or an orthogonal direction, with the main plane of the substrate, n being greater than m.

3. A microelectronic device with a random access memory (RAM), comprising a plurality of cells according to claim 2.

4. The microelectronic device according to claim 1, wherein the element is a static random access memory cell, the cell comprising:

at least one access transistor and at least one other access transistor respectively including a number m of channels parallel in a direction forming a non-zero angle with the main plane of the substrate; and a plurality of transistors forming a flip-flop, including at least one charge transistor and at least one other charge transistor respectively including a number k of channels parallel in a direction forming a non-zero angle, or an orthogonal direction, with the main plane of the substrate, m being greater than k.

5. The microelectronic device according to claim 1, wherein the element is a logic gate or a logic circuit comprising one or more logic gates.

6. The microelectronic device according to claim 1, the first transistor(s) being transistors of a first type between a P-type and an N-type, the second transistor(s) being transistors of a second type, between a P-type and an N-type, and different from the first type.

7. A method to form a microelectronic device comprising:
forming on a substrate one or more elements, the forming comprising:
forming one or more first transistors respectively including, in a direction forming a non-zero angle with the main plane of the substrate, a number m of channels in a form of a plurality of bars parallel to each other and to the substrate; and forming one or more second transistors respectively including, in a direction forming a non-zero angle with the main plane of the substrate, a number n of channels, such that n>m, in a form of a plurality of bars parallel to each other and to the substrate wherein the m channels of the first transistor(s) are formed in a first stack comprising a first number of semiconductor layers, the n channels of the second transistor(s) being formed in a second stack comprising a second number of semiconductor layers different from the first number.

8. The method according to claim 7, the first stack and the second stack being of a same height.

9. The method according to claim 8, the second stack comprising semiconductor layers of different thickness.

10. The method according to claim 7, the first stack and the second stack being formed of semiconductor layers in a first semiconductor material alternating with semiconductor layers in a second semiconductor material.

11. The method according to claim 7, wherein the elements comprise cells of a SRAM memory.

12. The method according to claim 7, wherein the elements comprise a logic gate or a logic circuit comprising one or more logic gates.

13. The method according to claim 12, the first transistor(s) being transistors of a first type, between a P-type and an N-type, the second transistor(s) being transistors of a second type, between a P-type and an N-type, different from the first type.

14. A microelectronic device comprising, on a substrate, at least one element comprising:

one or more first transistors including, in a direction forming a non-zero angle with the main plane of the substrate, a number n of parallel channels in a form of a plurality of bars parallel to each other and to the substrate; and one or more second transistors including, in a direction forming a non-zero angle with the main plane of the substrate, a number m of parallel channels such that n>m in a form of a plurality of bars parallel to each other and to the substrate, wherein the element is a static random access memory cell, the cell including at least one access transistor and at least one other access transistor respectively including a number m of channels parallel in a direction forming a non-zero angle with the main plane of the substrate, and a plurality of transistors forming a flip-flop, including at least one charge transistor and at least one other charge transistor respectively including a number k of channels parallel in a direction forming a non-zero angle, or an orthogonal direction, with the main plane of the substrate, m being greater than k.

* * * * *